(12) United States Patent
Kim et al.

(10) Patent No.: US 7,872,932 B2
(45) Date of Patent: Jan. 18, 2011

(54) METHOD OF PRECHARGING LOCAL INPUT/OUTPUT LINE AND SEMICONDUCTOR MEMORY DEVICE USING THE METHOD

(75) Inventors: Myeong-O Kim, Gyeonggi-do (KR); Byung-Chul Kim, Gyeonggi-do (KR); Yong-Gyu Chu, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 211 days.

(21) Appl. No.: 12/187,269

(22) Filed: Aug. 6, 2008

(65) Prior Publication Data
US 2009/0040853 A1 Feb. 12, 2009

(30) Foreign Application Priority Data
Aug. 8, 2007 (KR) .................. 10-2007-0079784

(51) Int. Cl.
*G11C 7/00* (2006.01)
(52) U.S. Cl. ............... 365/203; 365/230.03; 365/51
(58) Field of Classification Search .......... 365/203, 365/230.03, 51, 191, 200, 207, 63, 189.08, 365/189.09, 205, 190, 208
See application file for complete search history.

(56) References Cited

U.S. PATENT DOCUMENTS 6,256,245 B1* 7/2001 Kwak ................ 365/203
2004/0085841 A1* 5/2004 Lim et al. ................ 365/203
2007/0070670 A1* 3/2007 Ha et al. ................ 365/51

FOREIGN PATENT DOCUMENTS

| KR | 2006-0005627 | 1/2006 |
|---|---|---|
| KR | 2006-0038568 | 5/2006 |
| KR | 2006-0064256 | 6/2006 |

OTHER PUBLICATIONS

English language abstract of Korean Publication No. 2006-0005627.
English language abstract of Korean Publication No. 2006-0038568.
English language abstract of Korean Publication No. 2006-0064256.

* cited by examiner

*Primary Examiner*—Dang T Nguyen
(74) *Attorney, Agent, or Firm*—Muir Patent Consulting, PLLC

(57) ABSTRACT

A method and semiconductor memory device for precharging a local input/output line. The semiconductor memory device, which may have an open bit line structure, transmits data through local input/output lines that are coupled to bit lines of first to n-th memory cell array blocks (n being a natural number). The semiconductor memory device may include a precharge unit configured to generate a plurality of precharge signals and a controller configured to control precharging of the at least one local input/output line responsive to block information corresponding to activation of at least one of the memory cell array blocks and responsive to at least one of the precharge signals.

18 Claims, 4 Drawing Sheets

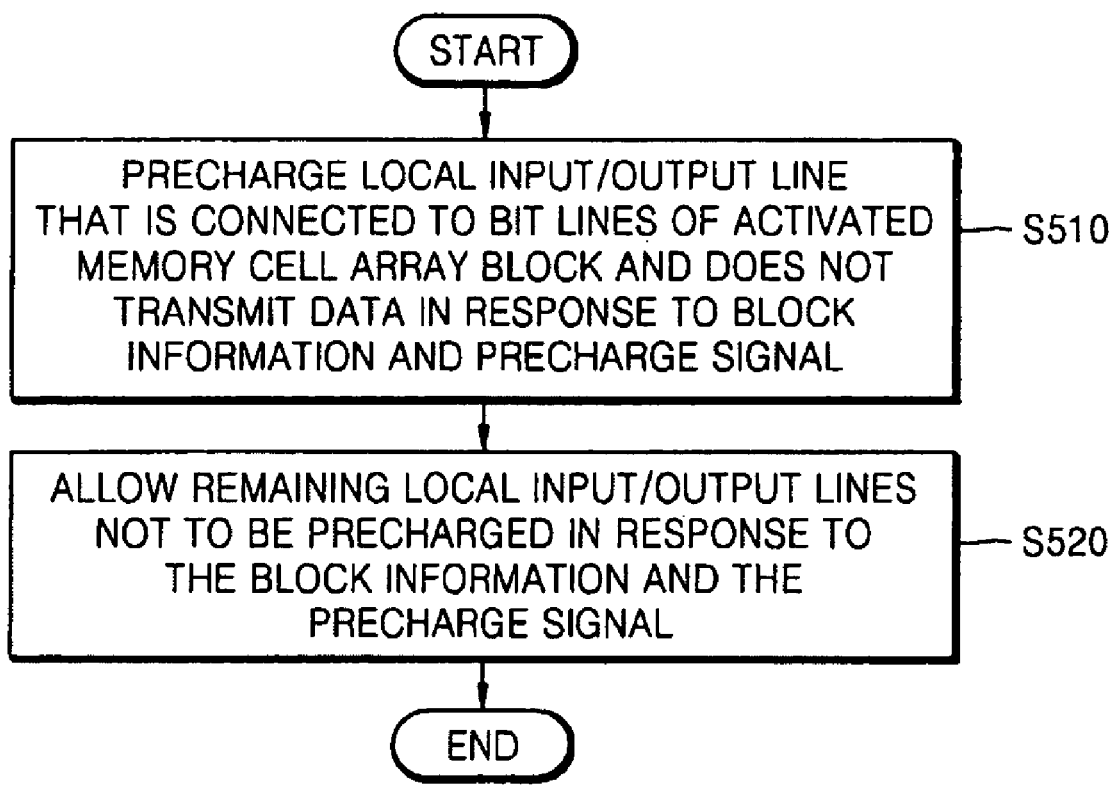

METHOD OF PRECHARGING LOCAL INPUT/OUTPUT LINE AND SEMICONDUCTOR MEMORY DEVICE USING THE METHOD

CROSS-REFERENCE TO RELATED PATENT APPLICATION

This application claims the benefit of Korean Patent Application No. 10-2007-0079784, filed on Aug. 8, 2007, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a method of precharging a local input/output line and a semiconductor memory device using the method.

2. Description of the Related Art

A semiconductor memory device includes a plurality of cells to store data. The cells are divided into memory cell array blocks having a predetermined number of the cells. The cells that are arrayed in corresponding blocks are divided into banks to be arrayed.

In the memory cell array blocks, memory cells are arrayed in units of a matrix. A plurality of word lines and a plurality of bit lines intersect with each other. In order to access data, a bank is selected, and one of the memory cell array blocks in the selected bank is accessed. Thereafter, one of the word lines in the selected memory cell array is activated, and the data is applied to a corresponding bit line. A sense amplifier senses, amplifies, and outputs a signal applied to the bit line. In this case, the sense amplifier detects a voltage difference between the bit line and an inverted bit line applied with a reference signal. Where the bit line applied with the data and the inverted bit line applied with the reference signal are arrayed in the same memory cell array block, such a structure is referred to as a folded bit line structure. Where the bit line and the inverted bit line are arrayed in adjacent two memory cell arrays, respectively, such a structure is referred to as an open bit line structure.

FIG. 1 is a block diagram illustrating a conventional semiconductor memory device 100 having the open bit line structure. Referring to FIG. 1, the semiconductor memory device 100 includes n memory cell array blocks MCB_1 to MCB_n. Sense amplifiers SA are coupled with bit lines BL and inverted bit lines /BL between the memory cell array blocks. However, outer memory cell array blocks MCB_1 and MCB_n have dummy bit lines DBL. Cells coupled to each dummy bit line DBL do not store data during a normal operation.

For example, when data of the memory cell array block MCB_1 is accessed, data is accessed through bit lines on the right; however, data cannot be accessed through dummy bit lines on the left. Instead, half of the cells of the memory cell array block MCB_k, which is disposed at a center region, are used. Specifically, when the data of the memory cell array block MCB_1 is accessed, the data is accessed through the bit lines on the right of the memory cell array block MCB_1 and bit lines on the left of the memory cell array block MCB_k and is transmitted through corresponding local input/output lines. While data is accessed through bit lines BL on the right of the memory cell array block MCB_k, the data is not transmitted through a local input/output line LIO_kR.

Similarly, when data of the memory cell array block MCB_n is accessed, the data is accessed through bit lines BL on the left of the memory cell array block MCB_n and bit lines BL on the right of the memory cell array block MCB_k disposed at the center region.

As described above, when either of the outer memory cell array blocks MCB_1 or MCB_n is activated, the memory cell array block MCB_k disposed at the center region is also activated. In this case, conventionally, all of the local input/output lines LIO_1, LIO_2L, LIO_2R . . . , and LIO_n are continuously precharged. As a result, when a write command or a read command is continuously performed to write or read data to or from the memory cell array blocks MCB_1 and MCB_k, the local input/output lines LIO_1, LIO_2L, LIO_k−1R, LIO_kL, LIO_kR, and LIO_k+1L are continuously precharged, thereby causing unnecessary power consumption.

In addition, even if the local input/output lines for transmitting data were configured so as not to be precharged, the semiconductor memory device 100 would not operate normally. For example, suppose that data of the memory cell array blocks MCB_1 and MCB_k is read or written and the local input/output lines LIO_1, LIO_2L, LIO_k−1R, LIO_kL, LIO_kR, and LIO_k+1L are not precharged. Under these conditions, the local input/output line LIO_kR is in a floating state. As a result, the semiconductor memory device 100 can not operate normally during the read or write operation.

SUMMARY OF THE INVENTION

The present invention may provide a semiconductor memory device capable of precharging a local input/output line that is coupled to bit lines for inputting/outputting data and does not transmit data so as to prevent excessive power consumption and an abnormal operation.

The present invention may also provide a method of precharging a local input/output line of the semiconductor memory device.

According to an aspect of the present invention, there may be provided a semiconductor memory device which has an open bit line structure and transmits data through local input/output lines that are coupled to bit lines of first to n-th memory cell array blocks (n is a natural number), including: a precharge unit outputting a plurality of precharge signals for determining whether or not the local input/output lines are to be precharged; and a controller controlling precharge of each of the local input/output lines responsive to block information corresponding to activation of each of the memory cell array blocks and the precharge signal, wherein the controller controls a local input/output line that is coupled to bit lines of and activated k-th memory cell array block ($2 \leq k \leq n-1$, k is a natural number) and does not transmit data is precharged and remaining local input/output lines are not precharged.

The number n may be an odd number, and the k-th memory cell array block may be an $\{(n+1)/2\}$-th memory cell array block.

When the block information and the precharge signal are enabled, the controller may control so that a corresponding local input/output line is precharged. When at least one of the block information and the precharge signal is disabled, the controller may control so that a corresponding local input/output line is not precharged.

The precharge unit may output first and second precharge signals for determining whether or not the local input/output lines are to be precharged, and the controller may include: a first control unit coupled to local input/output lines coupled to bit lines of the first to k-th memory cell array blocks excluding a local input/output line between the k-th and (k+1)-th memory cell array blocks; and a second control unit coupled to remaining local input/output lines excluding the local input/output lines coupled to the first control unit.

When the first and k-th memory cell array blocks are activated, the precharge unit may output the first precharge signal and the second precharge signal to the first control unit and the second control unit, respectively.

When the block information and the first precharge signal are enabled or the block information and the second precharge signal are enabled, the controller may control so that a corresponding local input/output line is precharged, and when at least one of the block information and the first precharge signal is disabled or at least one of the block information and the second precharge signal is disabled, the controller may control so that a corresponding local input/output line is not precharged.

When the k-th and n-th memory cell array blocks are activated, the precharge unit may output the second precharge signal and the first precharge signal to the first control unit and the second control unit, respectively.

When the block information and the first precharge signal are enabled or the block information and the second precharge signal are enabled, the controller may control so that a corresponding local input/output line is precharged, and when at least one of the block information and the first precharge signal is disabled or at least one of the block information and the second precharge signal is disabled, the controller may control so that a corresponding local input/output line is not precharged.

According to another aspect of the present invention, there is provided a semiconductor memory device which has an open bit line structure and transmits data through local input/output lines that are coupled to bit lines of first to n-th memory cell array blocks (n is a natural number), including: a precharge unit outputting a plurality of precharge signals for determining whether or not the local input/output lines are to be precharged; a controller comprising first and second control units for controlling precharge of each of the local input/output lines responsive to block information corresponding to activation of each of the memory cell array blocks and the precharge signal; a first node coupling the first control unit to the precharge unit; and a second node coupling the second control unit to the precharge unit, wherein the first control unit is coupled to local input/output lines coupled to bit lines of the first to k-th memory cell array blocks ($2 \leq K \leq n-a$, k is a natural number) excluding a local input/output line between the k-th and (k+1)-th memory cell array blocks, and wherein the second control unit is coupled to remaining local input/output lines excluding the local input/output lines coupled to the first control unit.

The controller may control so that a local input/output line that is coupled to bit lines of the activated k-th memory cell array block and does not transmit data is precharged and remaining local input/output lines are not precharged.

According to another aspect of the present invention, there is provided a method of precharging a local input/output line of a semiconductor memory device which has an open bit line structure and transmits data through local input/output lines that are coupled to bit lines of first to n-th memory cell array blocks (n is a natural number), including: precharging a local input/output line that is coupled to bit lines of an activated k-th memory cell array block ($2 \leq k \leq n-1$, k is a natural number) and does not transmit data, responsive to block information corresponding to activation of each of the memory cell array blocks and one of a plurality of precharge signals for determining whether or not the local input/output lines are to be precharged; and allowing remaining local input/output lines excluding the precharged local input/output line not to be precharged responsive to the block information and one of the precharge signals.

According to another aspect of the present invention, there is provided a method of precharging a local input/output line of a semiconductor memory device which has an open bit line structure and transmits data through local input/output lines that are coupled to bit lines of first to n-th memory cell array blocks (n is a natural number), including: applying block information on activation of each of the memory cell array blocks and a first precharge signal for determining whether or not the local input/output lines are to be precharged to local input/output lines coupled to bit lines of the first to k-th memory cell array blocks ($2 \leq k \leq n-1$, k is a natural number) excluding a local input/output line between the k-th and (k+1)-th memory cell array blocks; applying the block information and a second precharge signal for determining whether or not the local input/output lines are to be precharged to remaining local input/output lines; when the block information and the first or second precharge signal are enabled, precharging a corresponding local input/output line; and when at least one of the block information and the first or second precharge signal is disabled, allowing a corresponding local input/output line not to be precharged.

BRIEF DESCRIPTION OF THE DRAWINGS

The above and other features and advantages of the present invention will become more apparent by describing in detail exemplary embodiments thereof with reference to the attached drawings in which:

FIG. 5 is a flowchart of a method of precharging a local input/output line of the semiconductor memory device illustrated in FIG. 2.

DETAILED DESCRIPTION OF THE INVENTION

Figure 1:
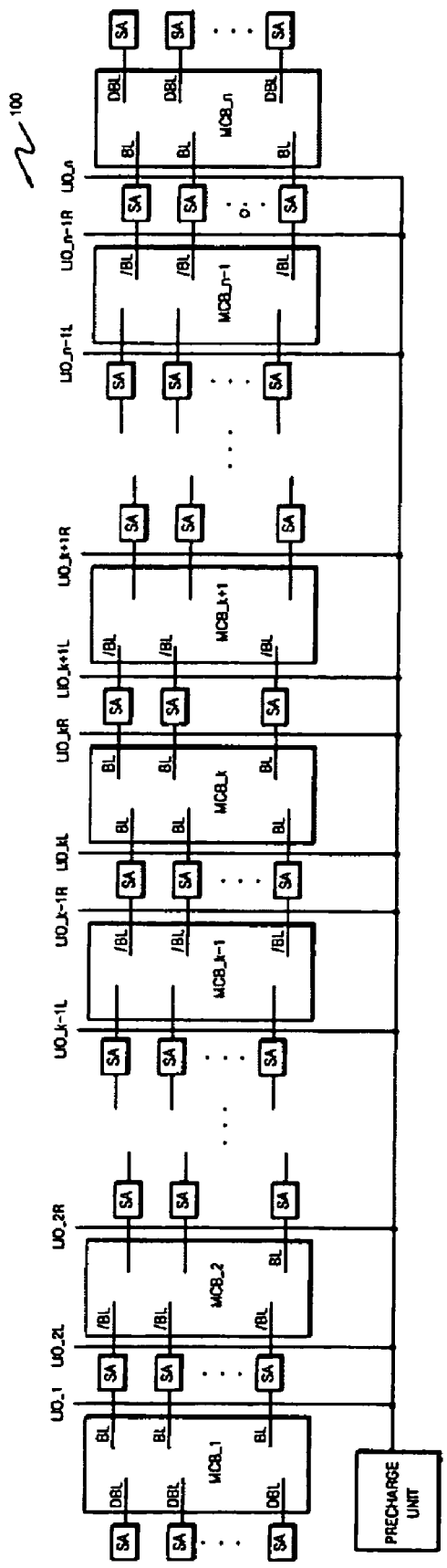
FIG. 1 is a block diagram illustrating a conventional semiconductor memory device having an open bit line structure.

The attached drawings for illustrating exemplary embodiments of the present invention are referred to in order to gain a sufficient understanding of the present invention, the merits thereof, and the objectives accomplished by the implementation of the present invention.

Hereinafter, exemplary embodiments of the present invention will be described in detail with reference to the attached drawings. Like reference numerals in the drawings denote like elements.

Figure 2:
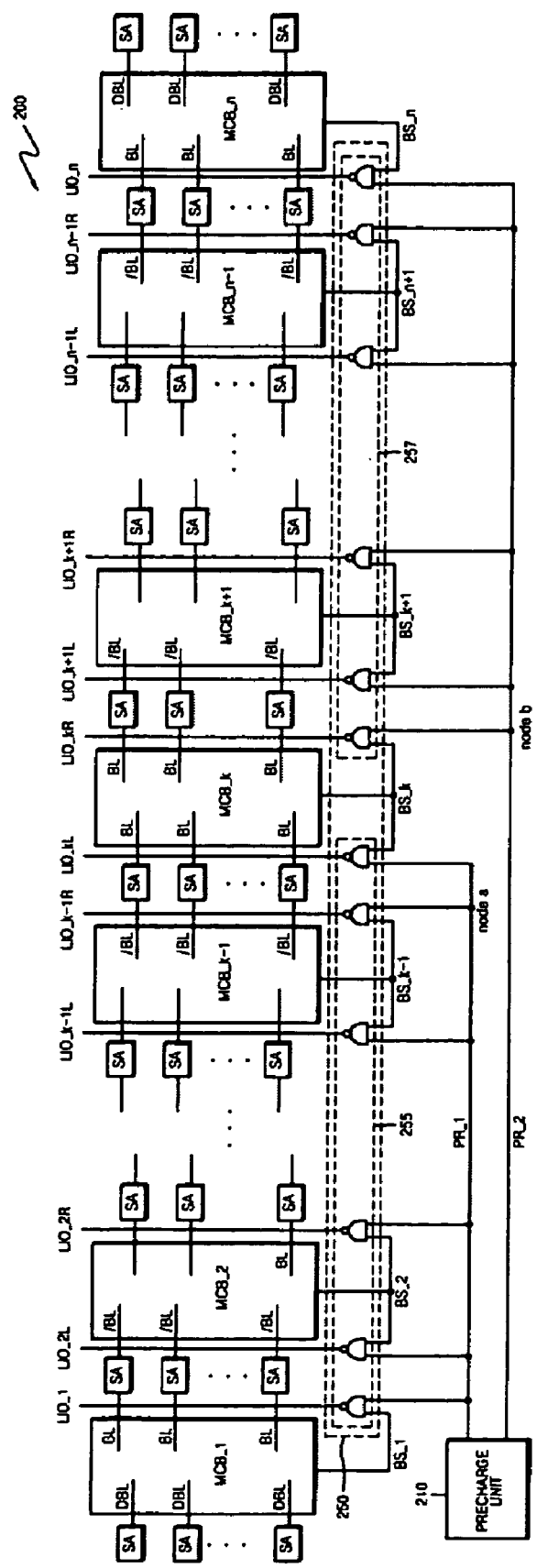
FIG. 2 is a block diagram illustrating a semiconductor memory device according to an embodiment of the present invention.

FIG. 2 is a block diagram illustrating a semiconductor memory device 200 according to an embodiment of the present invention. Referring to FIG. 2, the semiconductor memory device 200 may include first to n-th memory cell array blocks MCB_1 to MCB_n, a precharge unit 210, and a controller 250. The semiconductor memory device 200 includes a plurality of local input/output lines LIO_1, LIO_2L, LIO_2R, . . . , and LIO_n, and each local input/ output line is coupled with bit lines BL of a corresponding memory cell array block to transmit data. The semiconductor memory device 200 according to the embodiment of the present invention may have an open bit line structure. Therefore, sense amplifiers SA are coupled to bit lines BL and inverted bit lines /BL between the memory cell array blocks. In addition, outer memory cell array blocks MCB_1 and MCB_n have dummy bit lines DBL. Cells coupled to each dummy bit line DBL do not store data during a normal operation.

The precharge unit 210 outputs a plurality of precharge signals PR_1 and PR_2 for determining whether or not the local input/output lines LIO_1, LIO_2L, LIO_2R, . . . , and LIO_n are to be precharged. Although the two precharge signals are output in FIG. 2, it will be understood by those of ordinary skill in the art that more precharge signals may be output, and in this case, the same effects as those of the present invention can be achieved.

The controller 250 may control precharge of each of the local input/output lines LIO_1, LIO_2L, LIO_2R, . . . , and LIO_n responsive to block information BS_1 to BS_n on activation of each of the memory cell array blocks MCB_1 to MCB_n and the precharge signals PR_1 and PR_2. For example, the controller 250 may control precharge of the local input/output line LIO_1 responsive to the block information BS_1 on the first memory cell array block MCB_1 and the first precharge signal PR_1.

The controller 250 may include first and second control units 255 and 257. The first control unit 255 is coupled to the local input/output lines LIO_1, LIO_2L, LIO_2R, . . . , LIO_k−1R, and LIO_kL excluding the local input/output line LIO_kR between the k-th and (k+1)-th memory cell array blocks MCB_k and MCB_k+1. The local input/output lines LIO_1, LIO_2L, LIO_2R, . . . LIO_k−1R, LIO_kL, and LIO_kR are coupled to bit lines BL of the first to k-th memory cell array blocks MCB_1, MCB_2, . . . , MCB_k−1, and MCB_k. The second control unit 257 are coupled to remaining local input/output lines LIO_kR, LIO_k+1L, . . . , and LIO_n excluding the local input/output lines LIO_1, LIO_2L, LIO_2R, . . . , LIO_k−1R, and LIO_kL coupled to the first control unit 255.

In general, a semiconductor memory device having the open bit line structure includes an odd number of memory cell array blocks. Therefore, hereinafter, the semiconductor memory device 200 may have the odd number of the memory cell array blocks (n being an odd number). In addition, it is assumed that the k-th memory cell array block MCB_k is a memory cell array block disposed at a center region (i.e., k=(n+1)/2). As described above, when the outer memory cell array block MCB_1 or MCB_n is activated, generally, the memory cell array block MCB_k at the center is simultaneously activated. However, the k-th memory cell array block MCB_k does not need to be the memory cell array block at the center, and it will be understood by those of ordinary skill in the art that a memory cell array block at an arbitrary position activated along with the outer memory cell array block can achieve the same effects as those of the present invention.

Each of the first and second control units 255 and 257 may include a plurality of NAND gates. Each NAND gate performs a NAND operation on a piece of the block information BS_1 to BS_n and one of the precharge signals PR_1 and PR_2 and outputs a result of the NAND operation to a corresponding local input/output line. For example, the NAND gate coupled to the first local input/output line LIO_1 performs the NAND operation on the block information BS_1 on the first memory cell array block MCB_1 and the first precharge signal PR_1 to output a result of the NAND operation. Whether or not a corresponding local input/output line is to be precharged is determined according to an output signal of each NAND gate. According to the embodiment of the present invention, the NAND gates are used. However, it will be understood by those of ordinary skill in the art that when logic states of the block signals and the precharge signals are changed to use another logic gate, the same effects can be obtained.

The first control unit 255 and the precharge unit 210 may be coupled by a first node, node a, and the second control unit 257 and the precharge unit 210 may be coupled by a second node, node b. Specifically, the first precharge signal PR_1 output from the precharge unit 210 may be applied to the first control unit 255 through the first node, node a, and the second precharge signal PR_2 output from the precharge unit 210 may be applied to the second control unit 257 through the second node, node b.

Figure 3:
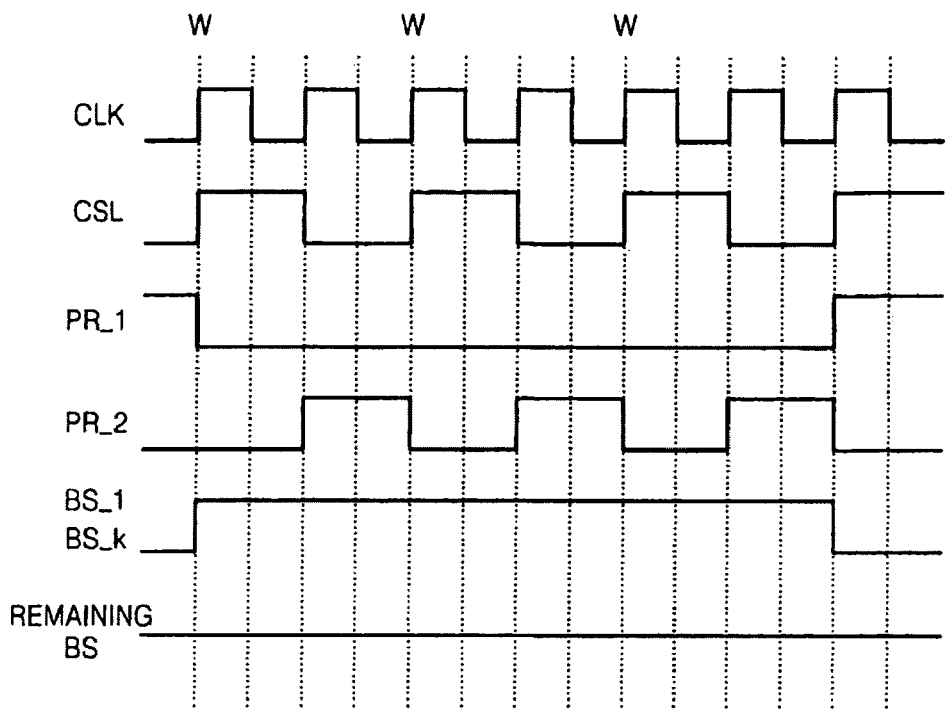
FIG. 3 is a waveform diagram of each signal when a first memory cell array block of the semiconductor memory device illustrated in FIG. 2 is activated.

FIG. 3 is a waveform diagram of each signal when the first memory cell array block MCB_1 of the semiconductor memory device 200 illustrated in FIG. 2 is activated.

Figure 4:
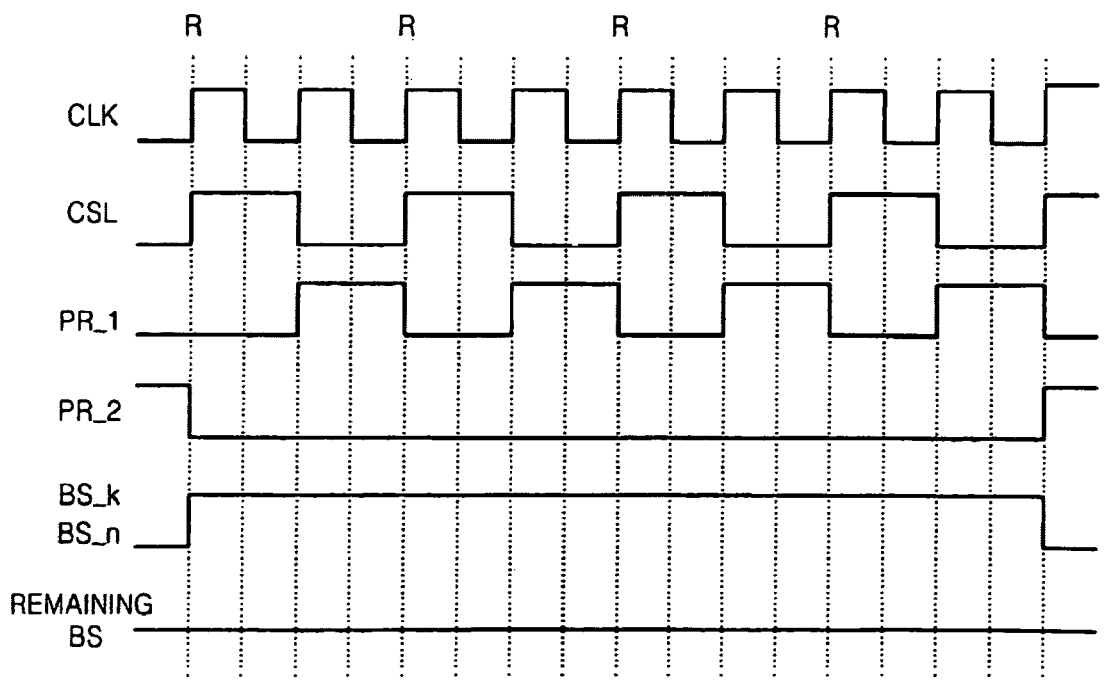
FIG. 4 is a waveform diagram of each signal when an n-th memory cell array block of the semiconductor memory device illustrated in FIG. 2 is activated.

FIG. 4 is a waveform diagram of each signal when the n-th memory cell array block MCB_n of the semiconductor memory device 200 illustrated in FIG. 2 is activated.

A precharging method performed by the semiconductor memory device 200 is described with reference to FIGS. 2 to 4. The semiconductor memory device 200 according to an embodiment of the present invention is effectively operated when the outer memory cell array block MCB_1 or MCB_n is activated. Hereinafter, a case where the outer memory cell array block MCB_1 or MCB_n is activated is described. As described above, when the outer memory cell array block MCB_1 or MCB_n is activated, an arbitrary memory cell array block is simultaneously activated. For purposes of explanation, it is assumed that when the outer memory cell array block MCB_1 or MCB_n is activated, the k-th memory cell array MCB_k is also activated. However, persons with skill in the art will recognize that a memory cell array block other than MCB_k can be activated.

In FIGS. 3 and 4, a column select line CSL has a cycle while a clock CLK has two cycles. Specifically, a read command or a write command may be input every two clocks CLK. The column select line CSL, which may correspond to the input of the read command or the write command, may be enabled at a beginning of a period of a clock CLK and disabled at an end of the period of the clock CLK.

First, a case where the first memory cell array block MCB_1 is activated is described with reference to FIGS. 2 and 3. When the first memory cell array block MCB_1 is activated, since data cannot be output through the dummy bit lines DBL, the k-th memory cell array block MCB_k may be activated. However, persons with skill in the art will recognize that a memory cell array block other than MCB_k can be activated. Where the k-th memory cell array block MCB_k is activated, data may be transmitted through the local input/output line LIO_kL coupled to bit lines BL on the left of the k-th memory cell array block MCB_k. However, data is not transmitted through the local input/output line LIO_kR coupled to bit lines on the right of the k-th memory cell array block MCB_k. Therefore, the semiconductor memory device 200 according to an embodiment of the present invention may control the local input/output lines LIO_1, LIO_2L, LIO_k−1R, and LIO_kL that transmit data, so that they are not precharged. Further, the local input/output line LIO_kR that is coupled to the bit lines BL of the activated memory cell array block MCB_k, which does not transmit data, may be precharged.

The precharge unit 210 may output the first precharge signal PR_1 to the first control unit 255 through the first node, node a. The first precharge signal PR_1 has a first logic state. Hereinafter, the first logic state means a logic low state. However, persons with skill in the art will recognize that the first logic state could also mean a logic high state. The precharge unit 210 may output the second precharge signal PR_2 to the second control unit 257 through the second node, node b. The second precharge signal PR_2 has a second logic state when the column select signal CSL is in the first logic state and has the first logic state when the column select signal CSL is in the second logic state. Hereinafter, the second logic state means a logic high state. However, persons with skill in the art will recognize that the second logic state could also mean a logic low state.

Since the first and k-th memory cell array blocks MCB_1 and MCB_k are in the activated state, the block information BS_1 and BS_k have the second logic state. Since the remaining memory cell array blocks MCB_2, ..., MCB_k−1, MCB_k+1, ..., and MCB_n are not in the activated state, the block information BS_2, ..., BS_k−1, BS_k+1, ..., and BS_n have the first logic state.

Each of the local input/output lines may be precharged when an output signal of the controller 250 is in the first logic state. Since a signal output from the first control unit 255 to the first local input/output line LIO_1 is in the second logic state, the local input/output line LIO_1 is not precharged. Specifically, since the first precharge signal PR_1 is in the first logic state, irrespective of the block information BS_1 to BS_k, the output signal of the first control unit 255 has the second logic state. Therefore, the local input/output lines LIO_1, LIO_2L, ..., and LIO_kL are not precharged.

A case where an output signal of the second control unit 257 has the first logic state may exist. Specifically, when the column select signal CSL is in the first logic state, a signal output from the second control unit 257 to the local input/output line LIO_kR has the first logic state. Therefore, the local input/output line LIO_kR is precharged. However, remaining local input/output lines LIO_k+1L, ..., and LIO_n coupled to the second control unit 257 are not precharged. Because the block information BS_k+1, ..., and BS_n is in the first logic state, irrespective of the second precharge signal PR_2, the signals output from the second control unit 257 to the local input/output lines LIO_k+1L, ..., and LIO_n have the second logic state.

Therefore, when the first and k-th memory cell array blocks MCB_1 and MCB_k are activated, only the local input/output line LIO_kR is precharged when the column select line CSL is in the first logic state. In addition, the remaining local input/output lines LIO_1, LIO_2L, ..., LIO_kL, LIO_k+1L, ..., and LIO_n are not precharged during a write operation. In FIG. 3, a case where the write operation is performed is exemplified. However, it will be understood by those of ordinary skill in the art that when a read operation is performed, substantially the same effects as those of the present invention can be achieved. Further, the local input/output lines LIO_1, LIO_2L, LIO_k−1R, and LIO_kL that are not precharged while transmitting data may be precharged when a column address is not input.

A case where the n-th memory cell array block MCB_n is activated is described with reference to FIGS. 2 and 4. When the n-th memory cell array block MCB_n is activated, data cannot be output through the dummy bit lines DBL. Instead, the k-th memory cell array block MCB_k may be activated. However, persons with skill in the art will recognize that a memory cell array block other than MCB_k can be activated. Where the k-th memory cell array block MCB_k is activated, data may be transmitted through the local input/output line LIO_kR coupled to the bit lines BL on the right of the k-th memory cell array block MCB_k. However, data is not transmitted through the local input/output line LIO_kL coupled to the bit lines on the left of the k-th memory cell array block MCB_k. Therefore, the semiconductor memory device 200 according to the embodiment of the present invention may control the local input/output lines LIO_kR, LIO_k+1L, LIO_n−1R, and LIO_n that transmit data, so that they are not precharged. Further, the local input/output line LIO_kL that is coupled to the bit lines BL of the activated memory cell array block MCB_k, which does not transmit the data, may be precharged.

The precharge unit 210 may output the first precharge signal PR_1 to the first control unit 255 through the first node, node a. In addition, the precharge unit 210 may output the second precharge signal PR_2 to the second control unit 257 through the second node, node b. The first precharge signal PR_1 in FIG. 4 is the same as the second precharge signal PR_2 in FIG. 3, and the second precharge signal PR_2 in FIG. 4 is the same as the first precharge signal PR_1 in FIG. 3. Specifically, the first precharge signal PR_1 has the second logic state when the column select signal CSL is in the first logic state and has the first logic state when the column select signal CSL is in the second logic state. In addition, the second precharge signal PR_2 has the first logic state.

Since the k-th and n-th memory cell array blocks MCB_k and MCB_n are in the activated state, the block information BS_k and BS_n has the second logic state. Since the remaining memory cell array blocks MCB_1, ..., MCB_k−1, MCB_k+1, ..., and MCB_n−1 are not in the activated state, the block information BS_1, ..., BS_k−1, BS_k+1, ..., and BS_n−1 has the first logic state.

Each of the local input/output lines may be precharged when the output signal of the controller 250 is in the first logic state. Since the second precharge signal PR_1 is in the first logic state, irrespective of the block information BS_k to BS_n, the output signal of the second control unit 255 has the second logic state. Therefore, the local input/output lines LIO_kR to LIO_n are not precharged.

A case where the output signal of the first control unit 255 has the first logic state may exist. Specifically, when the column select signal CSL is in the first logic state, a signal output from the first control unit 255 to the local input/output line LIO_kL has the first logic state. Therefore, the local input/output line LIO_kL is precharged. However, the remaining local input/output lines LIO_1 to LIO_k−1R coupled to the first control unit 255 are not precharged. This is because since the block information BS_1 to BS_k−1 is in the first logic state, irrespective of the first precharge signal PR_1, the output signals output from the first control unit 255 to the local input/output lines LIO_1 to LIO_k−1R have the second logic state.

Therefore, when the k-th and n-th memory cell array blocks MCB_k and MCB_n are activated, only the local input/output line LIO_kL is precharged when the column select line CSL is in the first logic state. In addition, the remaining local input/output lines LIO_1, LIO_2L, LIO_k−1R, LIO_kR, ..., and LIO_n are not precharged during the read operation. In FIG. 4, a case where the read operation is performed is exemplified. However, it will be understood by those of ordinary skill in the art that when the write operation is performed, substantially the same effects as those of the present invention can be achieved. Further, similar to the case in FIG. 3, the local input/output lines LIO_kR, LIO_k+1L, LIO_n−1R, and LIO_n that are not precharged while transmitting data may be precharged when a column address is not input.

FIG. 5 is a flowchart of a method of precharging a local input/output line of the semiconductor memory device 200 illustrated in FIG. 2. Referring to FIGS. 2 to 5, the semiconductor memory device 200 allows local input/output lines that are coupled to bit lines of an activated memory cell array block, and do not transmit data, to perform a precharging operation responsive to the block information and the precharge signal (operation S510). In addition, the remaining local input/output lines excluding the local input/output lines that perform the precharging operation do not perform the precharging operation responsive to the block information and the precharge signal (operation S520).

For example, when the first and k-th memory cell array blocks MCB_1 and MCB_k are activated as illustrated in FIG. 3, the local input/output line LIO_kR is precharged responsive to the block information BS_k and the second precharge signal PR_2. In other words, since both of the block information BS_k and the second precharge enable signal PR_2 are activated, the local input/output line LIO_kR is precharged. However, since at least one of the block information and the first or second precharge signal is disabled, the remaining local input/output lines LIO_1, . . . , LIO_kL, LIO_k+1L, . . . , and LIO_n are not precharged. In addition, since the first precharge signal PR_1 is disabled, the local input/output lines LIO_1 to LIO_kL are not precharged. In addition, since the block information on the corresponding memory cell array blocks MCB_k+1 to MCB_n are disabled, the local input/output lines LIO_k+1L to LIO_n are not precharged.

In some example embodiments, a method may be provided for precharging a local input/output line of a semiconductor memory device which has an open bit line structure and transmits data through local input/output lines that are coupled to bit lines of first to n-th memory cell array blocks (n is a natural number), comprising: precharging a local input/output line that is coupled to bit lines of an activated k-th memory cell array block (2≦k≦n−1, k is a natural number) and does not transmit data, responsive to block information corresponding to activation of each of the memory cell array blocks and one of a plurality of precharge signals for determining whether or not the local input/output lines are to be precharged; and allowing remaining local input/output lines excluding the precharged local input/output line not to be precharged responsive to the block information and one of the precharge signals.

In some example embodiments, a method may be provided wherein the number n is an odd number, and wherein the k-th memory cell array block is an {(n+1)/2}-th memory cell array block.

In some example embodiments, a method may be provided wherein precharging the local input/output line further comprises enabling the block information and the precharge signal, and wherein allowing the local input/output lines not to be precharged further comprises disabling at least one of the block information and the precharge signal.

In some example embodiments, a method may be provided wherein precharging the local input/output is precharging the local input/output line coupled to the bit lines of the k-th memory cell array block from among local input/output lines between the k-th and (k+1)-th memory cell array blocks, when the first and k-th memory cell array blocks are activated, and wherein allowing the local input/output lines not to be precharged is allowing the remaining local input/output lines excluding the precharged local input/output line not to be precharged.

In some example embodiments, a method may be provided wherein precharging the local input/output line is precharging the local input/output line coupled to the bit lines of the k-th memory cell array block from among local input/output lines between the k-th and (k−1)-th memory cell array blocks, when the k-th and n-th memory cell array blocks are activated, and wherein allowing the local input/output lines not to be precharged is allowing the remaining local input/output lines excluding the precharged local input/output line not to be precharged.

In some example embodiments, a method may be provided further comprising precharging at least one of the local input/output lines that are coupled to the bit lines of the activated memory cell array blocks and transmit data, when a column address is not input.

In some example embodiments, a method may be provided for precharging a local input/output line of a semiconductor memory device which has an open bit line structure and transmits data through local input/output lines that are coupled to bit lines of first to n-th memory cell array blocks (n is a natural number), comprising: applying block information on activation of each of the memory cell array blocks and a first precharge signal for determining whether or not the local input/output lines are to be precharged to local input/output lines coupled to bit lines of the first to k-th memory cell array blocks (2≦k≦n−1, k is a natural number) excluding a local input/output line between the k-th and (k+1)-th memory cell array blocks; applying the block information and a second precharge signal for determining whether or not the local input/output lines are to be precharged to remaining local input/output lines; when the block information and the first or second precharge signal are enabled, precharging a corresponding local input/output line; and when at least one of the block information and the first or second precharge signal is disabled, allowing a corresponding local input/output line not to be precharged.

In some example embodiments, a method may be provided wherein the number n is an odd number, and wherein the k-th memory cell array block is an {(n+1)/2}-th memory cell array block.

In some example embodiments, a method may be provided further comprising: when the first and k-th memory cell array blocks are activated, enabling block information corresponding to the activated memory cell array blocks and disabling remaining block information; disabling the first precharge signal; and enabling the second precharge signal.

In some example embodiments, a method may be provided further comprising: when the k-th and n-th memory cell array blocks are activated, enabling block information corresponding to the activated memory cell array blocks and disabling remaining block information; enabling the first precharge signal; and disabling the second precharge signal.

Accordingly, in the method of precharging a local input/output line and the semiconductor memory device using the method, local input/output lines which may be in a floating state are precharged, and remaining local input/output lines are not precharged. Therefore, excessive power consumption and an abnormal operation of the semiconductor memory device can be avoided.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A semiconductor memory device including an open bit line structure, comprising:
 a plurality of local input/output lines configured to transmit data, the local input/output lines being coupled to bit lines of first to n-th memory cell array blocks, wherein the first to n-th memory cell array blocks include a first through (k−1)-th, a k-th, and a (k+1)-th through n-th blocks, and at least one block includes dummy bit lines;
 a precharge unit configured to output at least a first and second precharge signals; and
 a controller comprising first and second control units, the first control unit being configured to receive the first precharge signal, the second control unit being configured to receive the second precharge signal, each of the first and second control units configured to control precharging of the local input/output lines, in response to (a) block information of at least one of the memory cell array blocks and (b) at least one of the precharge signals,
 wherein, for each block of the first to (k−1)-th blocks, the block is coupled to at least one local input/output line coupled to the first control unit, but is not coupled to the second control unit, the at least one local input/output line being coupled to bit lines of the block,
 wherein, for each block of the (k+1)-th to n-th blocks, the block is coupled to at least one local input/output line coupled to the second control unit, but is not coupled to the first control unit, the at least one local input/output line being coupled to bit lines of the block,
 wherein the k-th memory cell array block includes first bit lines that are coupled to a first local input/output line coupled to the first control unit, and second bit lines that are coupled to a second local input/output line coupled to the second control unit, and
 wherein either the first local input/output line or the second local input/output line of the k-th memory cell array block is precharged when a memory cell array block including dummy bit lines is activated.

2. The semiconductor memory device of claim 1, wherein the first local input/output line is not precharged and the second local input/output line is precharged when a memory cell array block that includes dummy bit lines and bit lines that are coupled to a local input/output line coupled to the first control unit is activated.

3. The semiconductor memory device of claim 1, wherein the second local input/output line is not precharged and the first local input/output line is precharged when a memory cell array block that includes dummy bit lines and bit lines that are coupled to a local input/output line coupled to the second control unit is activated.

4. The semiconductor memory device of claim 2, wherein the second local input/output line is disposed between the k-th and (k+1)-th memory cell array blocks and does not transmit data when the memory cell array block that includes dummy bit lines and bit lines that are coupled to a local input/output line coupled to the second control unit is activated.

5. The semiconductor memory device of claim 1, wherein the block information corresponds to activation of at least one of the memory cell array blocks, and wherein n is a natural number.

6. The semiconductor memory device of claim 5, wherein, when a column address is not input, the controller is configured to control precharging of the local input/output lines so that at least one of the local input/output lines that are coupled to the at least one activated memory cell array block is precharged.

7. The semiconductor memory device of claim 1,
 wherein the number n is an odd number, and
 wherein the k-th memory cell array block is an {(n+1)/2}-th memory cell array block.

8. A semiconductor memory device including an open bit line structure, comprising:
 a plurality of local input/output lines configured to transmit data, the local input/output lines coupled to bit lines of first to n-th memory cell array blocks, wherein the first to n-th memory cell array blocks include a first through (k−1)-th, a k-th, and a (k+1)-th through n-th blocks, and at least one block includes dummy bit lines, n being a natural number;
 a precharge unit configured to generate at least a first precharge signal and a second precharge signal; and
 a controller configured to control precharging of the at least one local input/output line responsive to block information corresponding to activation of at least one of the memory cell array blocks and responsive to at least one of the precharge signals,
 wherein, for each block of the first to (k−1)-th blocks, the block is coupled to at least one local input/output line coupled to the first precharge signal, but is not coupled to the second precharge signal, the at least one local input/output line being coupled to bit lines of the block,
 wherein, for each block of the (k+1)-th to n-th blocks, the block is coupled to at least one local input/output line coupled to the second precharge signal, but is not coupled to the first precharge signal, the at least one local input/output line being coupled to bit lines of the block,
 wherein a first local input/output line is coupled to first bit lines of the k-th memory cell array block and coupled to the first precharge signal,
 wherein a second local input/output line is coupled to second bit lines of the k-th memory cell array block and coupled to the second precharge signal, and
 wherein either the first local input/output line or the second local input/output line of the k-th memory cell array block is precharged when a memory cell array block including dummy bit lines is activated.

9. The semiconductor memory device of claim 8, wherein the first local input/output line is not precharged and the second local input/output line is precharged when a memory cell array block that includes dummy bit lines and bit lines that are coupled to a local input/output line coupled to the first precharge signal is activated.

10. The semiconductor memory device of claim 9, wherein the second local input/output line does not transmit data when the memory cell array block that includes dummy bit lines and bit lines that are coupled to a local input/output line coupled to the first precharge signal is activated.

11. The semiconductor memory device of claim 8,
 wherein the number n is an odd number, and
 wherein the k-th memory cell array block is an {(n+1)/2}-th memory cell array block.

12. The semiconductor memory device of claim 9, wherein the controller is configured to control precharging of the precharged local input/output line so that the precharged local input/output line is precharged responsive to the block information and the first and second precharge signals being enabled.

13. The semiconductor memory device of claim 9, wherein, when at least one of (a) the block information and (b) at least one of the precharge signals is disabled, the controller is configured to control pre charging so that a local input/output line corresponding to the at least one of (a) the disabled block information and (b) the disabled at least one precharge signal, is not precharged.

14. The semiconductor memory device of claim 9, wherein the controller comprises:
- a first control unit coupled to local input/output lines coupled to bit lines of the first to (k−1)-th memory cell array blocks; and
- a second control unit coupled to local input/output lines coupled to bit lines of the (k+1)-th to the n-th memory cell array blocks.

15. The semiconductor memory device of claim 8, wherein the controller comprises a plurality of NAND gates, each NAND gate corresponding to one local input/output line, the NAND gates configured to perform a NAND operation on the block information and the at least one of the first and second precharge signals, and to output a result of the NAND operation to the corresponding local input/output line.

16. The semiconductor memory device of claim 8, wherein, when a column address is not input, the controller is configured to control precharging of the at least one local input/output line so that at least one of the local input/output lines is precharged.

17. The semiconductor memory device of claim 8, wherein the second local input/output line is not precharged and the first local input/output line is precharged when a memory cell array block that includes dummy bit lines and bit lines that are coupled to a local input/output line coupled to the second precharge signal is activated.

18. The semiconductor memory device of claim 17, wherein the first local input/output line is disposed between the (k−1)-th and k-th memory cell array blocks and does not transmit data when the memory cell array block that includes dummy bit lines and bit lines that are coupled to a local input/output line coupled to the second precharge signal is activated.

* * * * *